United States Patent
Schwartz et al.

(10) Patent No.: US 7,058,555 B1
(45) Date of Patent: *Jun. 6, 2006

(54) PREDICTOR FOR OPTIMAL SELECTIVE POWER TRANSFER

(75) Inventors: David F. Schwartz, San Diego, CA (US); J. William Helton, Del Mar, CA (US); Jeffery C. Allen, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 823 days.

This patent is subject to a terminal disclaimer.

(21) Appl. No.: 10/157,413

(22) Filed: May 29, 2002

Related U.S. Application Data

(63) Continuation-in-part of application No. 09/540,438, filed on Mar. 31, 2000, now Pat. No. 6,622,092.

(51) Int. Cl.
*G06F 17/50* (2006.01)
*G01S 15/60* (2006.01)

(52) U.S. Cl. .............. 703/2; 703/14; 702/117; 367/89; 367/152

(58) Field of Classification Search .......... 703/2, 703/14; 324/601, 645, 680, 344; 330/54; 333/193; 367/152; 702/117; 326/30, 82
See application file for complete search history.

(56) References Cited

U.S. PATENT DOCUMENTS

| | | | | |
|---|---|---|---|---|
| 4,344,093 A | * | 8/1982 | Huber | 360/45 |
| 4,992,752 A | * | 2/1991 | Cioffi | 330/54 |
| 5,047,725 A | * | 9/1991 | Strid et al. | 324/601 |
| 5,121,063 A | * | 6/1992 | Kerkow et al. | 324/601 |
| 5,311,140 A | * | 5/1994 | Permuy | 324/680 |
| 5,334,960 A | * | 8/1994 | Penunuri | 333/193 |
| 5,422,860 A | * | 6/1995 | Bradley et al. | 367/89 |
| 5,436,846 A | * | 7/1995 | Fleming-Dahl | 716/4 |
| 5,557,637 A | * | 9/1996 | Glynn | 375/271 |
| 5,621,331 A | * | 4/1997 | Smith et al. | 324/645 |
| 5,708,587 A | * | 1/1998 | Franck et al. | 716/3 |
| 5,793,640 A | * | 8/1998 | Wu et al. | 702/65 |
| 5,794,008 A | * | 8/1998 | Meyers et al. | 716/4 |
| 6,622,092 B1 | * | 9/2003 | Schwartz et al. | 702/2 |

* cited by examiner

*Primary Examiner*—Thai Phan
(74) *Attorney, Agent, or Firm*—Peter A. Lipovsky; Michael A. Kagan; Allan Y. Lee

(57) ABSTRACT

A predictor for optimal transducer power gain computes the maximum transducer power gain attainable by a lossless matching network for a given load operating over selected non-overlapping (disjoint) sub-bands within a frequency band of operation.

3 Claims, 1 Drawing Sheet

PREDICTOR FOR OPTIMAL SELECTIVE POWER TRANSFER

CROSS-REFERENCE TO RELATED APPLICATION

This application is a continuation-in-part of commonly assigned pending U.S. patent application Ser. No. 09/540,438 filed 31 Mar. 2000 now U.S. Pat. No. 6,622,092 by inventors David F. Schwartz, J. William Helton and Jeffrey C. Allen. This related application is incorporated by reference herein.

BACKGROUND OF THE INVENTION

This invention relates generally to methods for estimating transducer power gain (TPG) from a source to a load. More specifically, but without limitation thereto, the invention relates to a computer program for finding the maximum TPG attainable by a lossless matching network for a given load operating over disjoint (non-overlapping) frequency sub-bands within a frequency band of operation.

Transmitters may be designed to transmit at specified frequency intervals (sub-bands) of an operational frequency band. Engineers utilize a variety of methods for constructing circuits that maximize TPG uniformly over these sub-bands. However, there is no known technique for determining the maximum TPG that is obtainable uniformly over the sub-bands.

Knowledge of the maximum performance attainable by a lossless matching circuit over sub-bands of a frequency band of operation is important in maximizing power radiated by an antenna operating over the sub-bands. This performance maximum provides an engineer a benchmark to grade the performance of proposed matching circuits. A circuit designer would also benefit from the knowledge of what is the greatest TPG both as a practical design goal and a quality indicator. Additionally, computing maximum TPG allows an engineer to determine trade-offs between various sub-bands of operation for a given load.

SUMMARY OF THE INVENTION

The invention computes the maximum TPG possible for any impedance-matching network for a given constant-resistance source (often represented by a transmission line), a load (often an antenna), and designated frequency sub-bands within a frequency band of operation.

An object of the invention is to compute maximum TPG to allow design engineers to decide whether a design objective for a given load and given frequency sub-bands can be attained.

Another object of the invention is to compute maximum TPG to allow an evaluation of trade-offs in system performance for various transmission sub-bands.

Yet another object of the invention is to calculate maximum TPG to provide a benchmark to grade the performance of proposed matching circuits.

Still a further object of the invention is to calculate directly from samples of a load's impedance the maximum TPG attainable over a collection of frequency sub-bands by a lossless impedance-matching network coupling a transmission line to the load.

Other objects, advantages and features of the invention will become apparent from the following description when taken in conjunction with the accompanying drawing.

DESCRIPTION OF THE INVENTION

Figure 1:
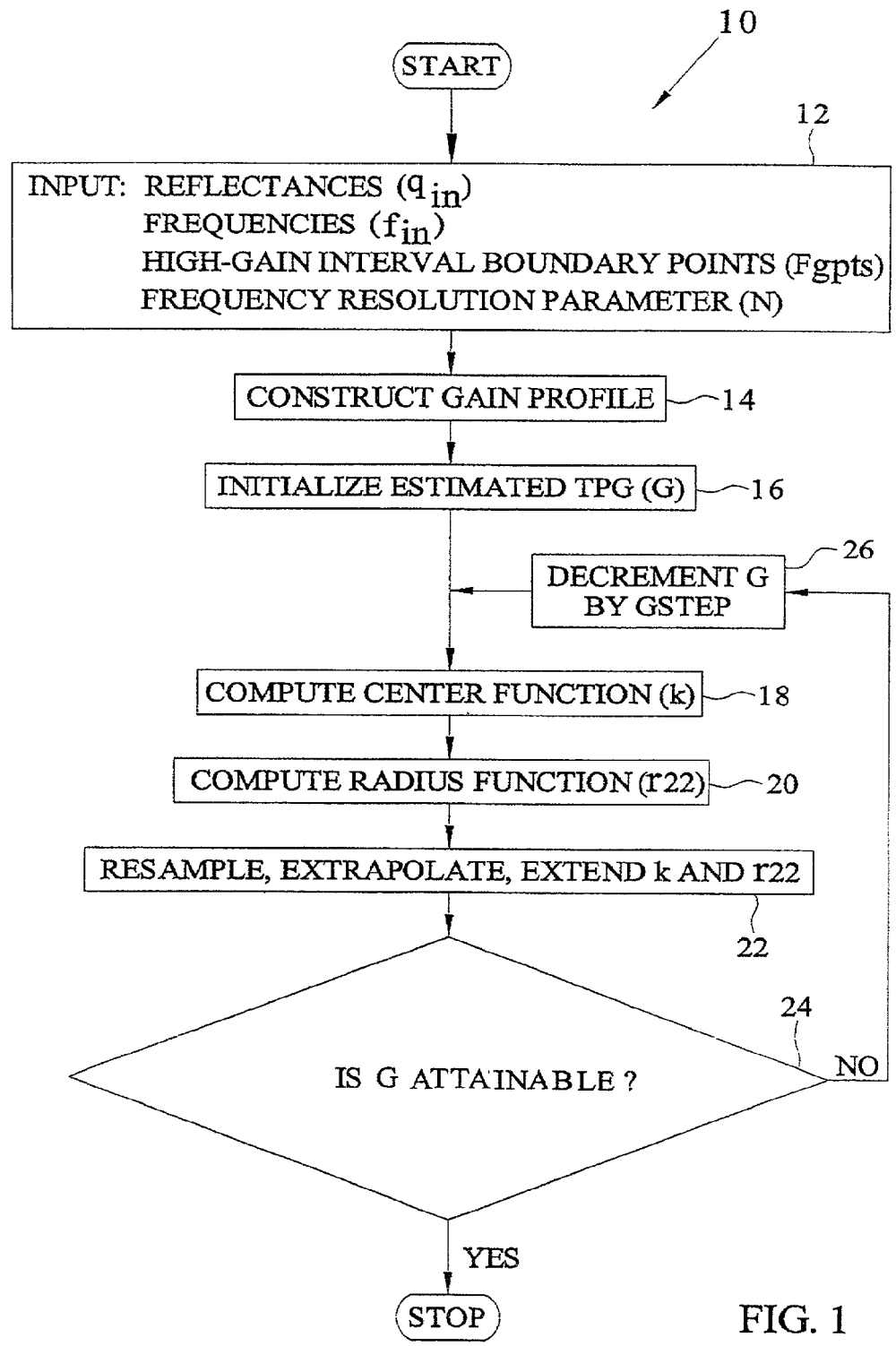
FIG. 1 is a flow chart of a computer process as may be used in accordance with the invention.

FIG. 1 is a flow chart of a computer program 10 for predicting maximum selective power transfer in accordance with the invention. This program incorporates Nehari's Theorem as a performance disk, such as is described in: Helton, J. W. & O. Merino [1998] *Classical Control Using $H^\infty$ Methods: Theory, Optimization, and Design,* Society for Industrial and Applied Mathematics.

Step 12 of this program inputs sampled load reflectance values qin measured at frequencies fin. For example, qin may be 401 samples corresponding to frequencies fin equally spaced from 2 to 8 MHz inclusive. The samples of the reflectance of the load are normalized to the characteristic impedance of the transmission line.

Also input at step 12 are the quantities FGpts which represent the beginning and ending frequency of each frequency sub-band that the gain is desired to be optimized over. Examples of such sub-bands in MHz are: 2 to 4, 5 to 6, and 7 to 8. Each sub-band falls within a frequency band of operation F, in this example 2 to 8 MHz. One may also input a desired frequency resolution parameter N as $2^I$ where I is an integer. As an example the parameter N is 1024. Typical values for N are 256, 512, and 1024.

In step 14 a profile of the gain for the selected sub-bands is constructed, delineating maximum-gain intervals. This profile is given by the identity "Gprofile".

Step 16 sets an estimated maximum attainable TPG. The estimated maximum TPG is represented by the symbol (G), and is set in terms of a transducer power gain parameter G0, wherein G equals G0 times Gprofile. The quantity G0 is initialized at 1, representing a "complete" transmission of power.

At step 18 a function k is computed that corresponds to the center of a disk defined by reflectance (qin and fin values) and gain (G).

At step 20 a radius function r22 is computed that corresponds to the square of the radius of the disk defined by the reflectance and gain.

At step 22, k and r22 are resampled over a frequency grid defined by N and the operating frequency band, extended to include negative frequencies and extrapolated to smooth end points at infinity.

In step 24, from the extended k and extended r22, a determination is made as to whether G is the maximum attainable. In an embodiment of the invention this is mathematically equivalent to determining whether a reflectance function exists within the disk in function space whose center is given by k and whose radius squared is r22. If so, the current estimate of the TPG is output as maximum attainable. Otherwise G0 is decremented at step 26 by an amount Gstep, for example, 0.001. The quantity G is re-computed as G0 times Gprofile. Processing then continues from step 18.

The following is an exemplary computer program of the present invention in MATLAB as a function titled "AGopt". Within this program the reflectance function is defined to be a function analytic on the right half of the complex plane (extended to include the imaginary axis), conjugate-symmetric across the real axisi, and bounded in magnitude by one.

```
function G = AGopt(fin,qin,FGpts,N)
    freq = fin;
    Nfreq = length(freq);
    gimped = qin;
    f1 = freq(1);
    fmax = freq(end);
    [Ngr, M] = size(FGpts);
    Nfc = N;
% Find indices of freq corresponding to the frequency interval bounds in FGpts
    iFGpts = zeros(size(FGpts));
    for igr = 1:Ngr,
        FG1 = FGpts(igr,1);
        iFGpts(igr,1) = min( find(abs(freq-FG1) == min(abs(freq-FG1))) );
        FG2 = FGpts(igr,2);
        iFGpts(igr,2) = max( find(abs(freq-FG2) == min(abs(freq-FG2))) );
end
% Create gain profile (Gprofile) delineating maximum-gain intervals
    Gprofile = zeros(Nfreq,1);
    f00 = f1;
    for igr = 1:Ngr,
        f0 = f00 + .67*(FGpts(igr,1)-f00);
        if0 = find(abs(freq-f0) == min(abs(freq-f0)));
        Gprofile(if0:iFGpts(igr,2)) = StepSpline(f0,FGpts(igr,1),freq(if0:iFGpts(igr,2)),'up');
        if igr < Ngr
            f01 = FGpts(igr,2) + .33*(FGpts(igr+1,1)-FGpts(igr,2));
            Gprofile(iFGpts(igr,2):iFGpts(igr+1,1)) = ...
                StepSpline(FGpts(igr,2),f01,freq(iFGpts(igr,2):iFGpts(igr+1,1)),'down');
            f00 = FGpts(igr,2);
        else                          % igr = Ngr
            if freq(end) - FGpts(igr,2) < 4,
                Gprofile(iFGpts(igr,2):end) = 1;
            else
                f01 = FGpts(igr,2) + .33*(freq(end)-FGpts(igr,2));
                Gprofile(iFGpts(igr,2):end) = ...
                    StepSpline(FGpts(igr,2),f01,freq(iFGpts(igr,2):end),'down');
            end
        end
    end
% Limit magnitude of reflectance data.
gmax = 0.99;
igb = find( abs(gimped) >= gmax );
gimped(igb) = gmax * gimped(igb) ./ abs(gimped(igb));
% Obtain frequency grid corresponding to equal spacing on the circle.
freq_grid = jwgrid( Nfc, fmax );
% Spline reflectances data to all of freq_grid
gamma = InExSpline( freq, gimped, freq_grid, 0, 0 );
% Initialize gain, decrement, and exit parameter
G0 = 1.0;
Gstep = 0.001;
tau = 1111;
% Step down maximum gain parameter (G0) in "while" loop.
while tau > 1,
G0 = G0 - Gstep;
G = G0 * Gprofile;
% Define center function and r2
% First, define common factor
denom = (1 - (abs(gimped).^2).*(1-G));
% Build center function, magnitude bounded by 1, extrapolating to 0.
center = G.*conj(gimped) ./ denom;
% Extend center function outside the operating band
cmax = 0.99; c0 = 0;
fstart = freq_grid( find(freq_grid < freq(1)) );
Nstart = length( fstart );
ftail = freq_grid( find(freq_grid > freq(end)) );
Ntail = length( ftail );
Ntailstep = ceil(min(20,.1*Ntail));
cstart = c0+(center(1)-c0)*StepSpline(fstart(1),fstart(end),fstart,'up');
ctail = c0 + (center(end) - c0)* ...
    StepSpline(ftail(fix(Ntailstep/4)),ftail(2*Ntailstep),ftail,'down');
center = InExSpline( ...
    [fstart; freq; ftail], ...
    [cstart; center; ctail], freq_grid, 0, 0 );
ic = find( abs(center) > cmax );
center(ic) = cmax * center(ic) ./ abs(center(ic));
% Fill as z = (j*omega - 1)/(j*omega + 1): Data corresponding to positive
% frequencies map clockwise around the circle with 0 going to -1.
k = [0; center(Nfc:-1:1); conj(center(1:(Nfc-1)))];
% Define radius^2 function, r2.
r2 = (1-G).*abs((1-abs(gimped).^2) ./ denom).^2;
```

```
-continued r2min = min(r2);
r2max = .99;
Nsteps = N;
r2_0 = r2max; r2_infty = r2max;
r2ave1 = (r2_0 + r2(1))/2; r2ave2 = (r2_infty + r2(end))/2;
r2tail = r2(end)+(r2_infty – r2(end))* . . .
        StepSpline(ftail(fix(Ntailstep/4)),ftail(2*Ntailstep),ftail,'up');
Nsflat = min(length(fstart)–1,Nsteps);
r2start = r2(1)+(r2_0 – r2(1))*StepSpline(fstart(1),fstart(end),fstart,'down');
r2 = InExSpline( [fstart(:);freq;ftail(:)], . . .
     [r2start(:); r2(:); r2tail(:)], freq_grid, r2_0, r2_infty );
r2 = min(r2max,max(r2,r2min));
r22 = [r2(Nfc); r2(Nfc:–1:1); conj(r2(1:(Nfc–1)))];    % symmetric extension
[h, tau] = NehariDisk( k, r22 );
end       % while loop
% end Agopt
%The function jwgrid may be calculated by the following:
function f = jwgrid( N, fmax );
theta = [0:(pi/N):pi]';
f = fmax * cot( theta(2:N+1) );
% end jwgrid
% The function InExSpline may be calculated by the following:
function h = InExSpline( fin, hin, f, hlb, hub )
fmin = min( fin );
fmax = max( fin );
index = find( fmin <= f & f <= fmax );
h = spline( fin, hin, f(index) );
index = find( f < fmin );
h = [hlb*ones(length(index),1); h];
index = find( f > fmax );
h = [h; hub*ones(length(index),1)];
% end InExSpline
% The function StepSpline may be calculated by the following:
function h = StepSpline(f0,f1,f,iupdwn)
h = zeros(size(f));
hslope = .25;
i0 = find( f <= f0 );
i1 = find( f >= f1 );
i01 = find( f > f0 & f < f1 );
switch iupdwn
    case 'up'
        h(i0) = 0;
        h(i1) = 1;
        h(i01) = tanh( hslope*(f(i01) – f0)./(f1 – f(i01)) );
    case 'down'
        h(i0) = 1;
        h(i1) = 0;
        h(i01) = tanh( .25*(f1 – f(i01))./(f(i01) – f0) );
end
% end StepSpline
%The function NehariDisk may be calculated by the following:
function [h,tau] = NehariDisk(c,R2)
a = exp( hilbert( log( max(R2,eps) )/2 ) );   % spectral factorization
k = c ./ a;
[h,tau] = Nehari(k);
h = h .* a;
% end NehariDisk
%The function Nehari may be calculated by the following:
function [h,tau] = Nehari(k)
N = length(k);            % length(k), for example, is a power of 2.
z = exp(i*2*pi*[0:(N–1)]');
K = fft( k,N ) / N;
K = K(N:–1:1+N/2);        % negative Fourier coefficients selected, for example
H hankel( K );
[U,S,V] = svd( H, 0 );
tau = S(1,1);
f = polyval( V(N/2:–1:1,1), z );
h = k – tau*polyval( U(N/2:–1:1,1), conj(z) ) ./ f;
% end Nehari
```

The search for the maximum attainable TPG is terminated when tau is returned with a value less than one.

For the example given, the output of AGopt is G=0.722 as the largest TPG obtainable by a matching circuit for the frequency sub-bands chosen. There are two often-used parameters computed from G:

(1) The power mismatch (pm) is the square root of 1−G; and (2) The voltage standing wave ratio (VSWR)=(1+pm)/(1−pm).

For the example parameters given, the corresponding power mismatch is 0.527 and VSWR equal to 3.23.

Obviously, many modifications and variations of the invention are possible in light of the above description. It is therefore to be understood that within the scope of the claims the invention may be practiced otherwise than as specifically described.

What is claimed is:

1. A method for calculating maximum transducer power gain from a source whose impedance is a constant resistance to a load comprising the following steps:
   (a) inputting reflectance values qin as taken from said load and inputting corresponding frequency values fin over a selected frequency band that includes a plurality of disjoint frequency sub-bands defined by FGpts;
   (b) constructing a gain profile Gprofile from said fin values and said FGpts,
   (c) initializing a proposed maximum attainable transducer power gain value G from said Gprofile and a power gain parameter G0;
   (d) computing a center function k from said G, said fin values and said qin values;
   (e) computing a radius function r22 from said G, said fin values and said qin values;
   (f) resampling k and r22 over a defined frequency grid;
   (g) extrapolating said resampled k and said resampled r22 to smooth end points;
   (h) extending said extrapolated and smoothed k and said extrapolated and smoothed r22 to negative frequencies;
   (i) determining whether G is attainable from said extended k and said extended r22;
   (j) decrementing G0 and continuing from step (c) if G is not attainable in step (i); and
   (k) outputting G once attainable from said extended k and said extended r22,
   wherein said outputted G is equated with said maximum transducer power gain.

2. A computer program product comprising:
   a medium for embodying a computer program for input to a computer;
   and a computer program embodied in said medium for coupling to the computer to calculate a maximum transducer power gain from a source whose impedance is a constant resistance to a load by performing the following functions:
   (a) inputting reflectance values qin as taken from said load and inputting corresponding frequency values fin over a selected frequency band that includes a plurality of disjoint frequency sub-bands defined by FGpts;
   (b) constructing a gain profile Gprofile from said fin values and said FGpts,
   (c) initializing a proposed maximum attainable transducer power gain value G from said Gprofile and a power gain parameter G0;
   (d) computing a center function k from said G, said fin values and said qin values;
   (e) computing a radius function r22 from said G, said fin values and said qin values;
   (f) resampling k and r22 over a defined frequency grid;
   (g) extrapolating said resampled k and said resampled r22 to smooth end points;
   (h) extending said extrapolated and smoothed k and said extrapolated and smoothed r22 to negative frequencies;
   (i) determining whether G is attainable from said extended k and said extended r22;
   (j) decrementing G0 and continuing from step (c) if G is not attainable in step (i); and
   (k) outputting G once attainable from said extended k and said extended r22,
   wherein said outputted G is equated with said maximum transducer power gain.

3. The computer program product of claim 2 wherein G is calculated substantially by the following:

```
function G = AGopt(fin,qin,FGpts,N)
    freq = fin;
    Nfreq = length(freq);
    gimped = qin;
    f1 = freq(1);
    fmax = freq(end);
    [Ngr, M] = size(FGpts);
    Nfc = N;
    iFGpts = zeros(size(FGpts));
    for igr = 1:Ngr,
        FG1 = FGpts(igr,1);
        iFGpts(igr,1) = min( find(abs(freq-FG1) == min(abs(freq-FG1))) );
        FG2 = FGpts(igr,2);
        iFGpts(igr,2) = max( find(abs(freq-FG2) == min(abs(freq-FG2))) );
end
    Gprofile = zeros(Nfreq,1);
    f00 = f1;
    for igr = 1:Ngr,
        f0 = f00 + .67*(FGpts(igr,1)-f00);
        if0 = find(abs(freq-f0) == min(abs(freq-f0)));
        Gprofile(if0:iFGpts(igr,2)) = StepSpline(f0,FGpts(igr,1),freq(if0:iFGpts(igr,2)),'up');
        if igr < Ngr
            f01 = FGpts(igr,2) + .33*(FGpts(igr+1,1)-FGpts(igr,2));
            Gprofile(iFGpts(igr,2):iFGpts(igr+1,1)) = . . .
                StepSpline(FGpts(igr,2),f01,freq(iFGpts(igr,2):iFGpts(igr+1,1)),'down');
            f00 = FGpts(igr,2);
        else
            if freq(end) - FGpts(igr,2) < 4,
                Gprofile(iFGpts(igr,2):end) = 1;
            else
                f01 = FGpts(igr,2) + .33*(freq(end)-FGpts(igr,2));
                Gprofile(iFGpts(igr,2):end) = . . .
                    StepSpline(FGpts(igr,2),f01,freq(iFGpts(igr,2):end),'down');
```

-continued

```
            end
        end
    end
gmax = 0.99;
igb = find( abs(gimped) >= gmax );
gimped(igb) = gmax * gimped(igb) ./ abs(gimped(igb));
freq_grid = jwgrid( Nfc, fmax );
gamma = InExSpline( freq, gimped, freq_grid, 0, 0 );
G0 = 1.0;
Gstep = 0.001;
tau = 1111;
while tau > 1,
G0 = G0 − Gstep;
G = G0 * Gprofile;
denom = (1 − (abs(gimped).^2).*(1−G));
center = G.*conj(gimped) ./ denom;
cmax = 0.99; c0 = 0;
fstart = freq_grid( find(freq_grid < freq(1)) );
Nstart = length( fstart );
ftail = freq_grid( find(freq_grid > freq(end)) );
Ntail = length( ftail );
Ntailstep = ceil(min(20,.1*Ntail));
cstart = c0+(center(1)−c0)*StepSpline(fstart(1),fstart(end),fstart,'up');
ctail = c0 + (center(end) − c0)* . . .
    StepSpline(ftail(fix(Ntailstep/4)),ftail(2*Ntailstep),ftail,'down');
center = InExSpline( . . .
    [fstart; freq; ftail], . . .
    [cstart; center; ctail], freq_grid, 0, 0 );
ic = find( abs(center) > cmax );
center(ic) = cmax * center(ic) ./ abs(center(ic));
k = [0; center(Nfc:−1:1); conj(center(1:(Nfc−1)))];
r2 = (1−G).*abs((1−abs(gimped).^2) ./ denom).^2;
r2min = min(r2);
r2max = .99;
Nsteps = N;
r2_0 = r2max; r2_infty = r2max;
r2ave1 = (r2_0 + r2(1))/2; r2ave2 = (r2_infty + r2(end))/2;
r2tail = r2(end)+(r2_infty − r2(end))* . . .
    StepSpline(ftail(fix(Ntailstep/4)),ftail(2*Ntailstep),ftail,'up';
Nsflat = min(length(fstart)−1, Nsteps);
r2start = r2(1)+(r2_0 − r2(1))*StepSpline(fstart(1),fstart(end),fstart,'down');
r2 = InExSpline( [fstart(:);freq;ftail(:)], . . .
    [r2start(:); r2(:); r2tail(:)], freq_grid, r2_0, r2_infty );
r2 = min(r2max,max(r2,r2min));
r22 = [r2(Nfc); r2(Nfc:−1:1); conj(r2(1:(Nfc−1)))];
[h, tau] = NehariDisk( k, r22 );
end
        wherein the function jwgrid is calculated substantially by the following:
function f = jwgrid( N, fmax );
theta = [0:(pi/N):pi]';
f = fmax * cot( theta(2:N+1) );
        wherein the function InExSpline is calculated substantially by the following:
function h = InExSpline( fin, hin, f, hlb, hub )
fmin = min( fin );
fmax = max( fin );
index = find( fmin <= f & f <= fmax );
h = spline( fin, hin, f(index) );
index = find( f < fmin );
h = [hlb*ones(length(index),1); h];
index = find( f > fmax );
h = [h; hub*ones(length(index),1)];
        wherein the function StepSpline is calculated substantially by the following:
function h = StepSpline(f0,f1,f,iupdwn)
h = zeros(size(f));
hslope = .25;
i0 = find( f <= f0 );
i1 = find( f >= f1 );
i01 = zfind( f > f0 & f < f1 );
switch iupdwn
    case 'up'
        h(i0) = 0;
        h(i1) = 1;
        h(i01) = tanh( hslope*(f(i01) − f0)./(f1 − f(i01)) );
    case 'down'
        h(i0) = 1;
        h(i1) = 0;
        h(i01) = tanh( .25*(f1 − f(i01))./(f(i01) − f0) );
        wherein the function NehariDisk is calculated substantially by the following:
function [h,tau] = NehariDisk(c,R2)
```

-continued

```
a = exp( hilbert( log( max(R2,eps) )/2 ) );
k = c ./ a;
[h,tau] = Nehari(k);
h = h .* a;
            wherein the function Nehari is calculated substantially by the following:
function [h,tau] = Nehari(k)
N = length(k);
z = exp(i*2*pi*[0:(N−1)]');
K = fft( k, N ) / N;
K = K(N:−1:1+N/2);
H = hankel( K );
[U,S,V] = svd( H, 0 );
tau = S(1,1);
f = polyval( V(N/2:−1:1,1), z );
h = k − tau*polyval( U(N/2:−1:1,1), conj(z)) ./ f;
``` wherein tau is returned with a value less than one when G substantially equals the maximum transducer power gain.

* * * * *